United States Patent [19]

Mueller et al.

[11] Patent Number: 4,628,199
[45] Date of Patent: Dec. 9, 1986

[54] ROTARY NOISELESS DETENT SWITCH

[76] Inventors: Michael M. Mueller, 7925 S. W. 11th Ave., Portland, Oreg. 97219; Thomas D. Gonzales, 8810 S. W. Alden St., Portland, Oreg. 97223

[21] Appl. No.: 541,697
[22] Filed: Oct. 13, 1983
[51] Int. Cl.[4] ............................................. G01D 5/34
[52] U.S. Cl. ............................ 250/229; 250/231 SE; 335/272
[58] Field of Search ............. 250/229, 231 SE, 237 G; 335/205, 206, 207, 272; 200/67 F

[56] References Cited

U.S. PATENT DOCUMENTS

| 3,344,378 | 9/1967 | Wilhelmson | 335/272 |
|---|---|---|---|
| 3,477,047 | 11/1969 | Jeffery | 335/206 |
| 3,800,204 | 3/1974 | Kenney | 318/480 |
| 3,995,156 | 11/1976 | Angersbach et al. | 250/237 G |
| 4,010,464 | 3/1977 | Wires et al. | 250/231 SE |
| 4,054,944 | 10/1977 | Lau | 335/207 |
| 4,146,970 | 4/1979 | Edwards | 33/363 K |
| 4,199,741 | 4/1980 | Paulet | 335/206 |
| 4,326,128 | 4/1982 | Klein | 250/231 SE |
| 4,334,222 | 6/1982 | Kelley et al. | 250/231 SE |
| 4,353,049 | 10/1982 | Lerner et al. | 335/205 |
| 4,375,592 | 3/1983 | Cox | 250/231 SE |

Primary Examiner—David C. Nelms
Assistant Examiner—James G. Gatto
Attorney, Agent, or Firm—Jack E. Day

[57] ABSTRACT

A noiseless rotary detent switch, wherein a ferromagnetic projection passes in close proximity to a magnetic pole, in combination with a first photoelectric detector for detecting the leading and trailing edges of said projection and a second photoelectric detector for detecting the presence or absence of said projection, the magnetic attraction between said projection and said pole providing the noiseless detent action and said first and said second photoelectric detectors providing electric signals for actuating switches in a sequence corresponding to that of the direction of rotation of said rotary switch.

9 Claims, 2 Drawing Figures

ROTARY NOISELESS DETENT SWITCH

FIELD OF THE INVENTION

This invention relates to rotary electrical switches in general, and to a noiseless detent rotary electrical switch with a distinct tactile detent in particular.

BACKGROUND OF THE INVENTION

Most electrical switches, especially of the rotary type, have a mechanical detent to ensure a positive rest position for the switch contacts, to make it difficult to move the switch accidentally from a given position, to provide a tactile confirmation that the switch is in a desired position and, in some cases, to provide audible confirmation to the user, by the "click" produced by the detent, that a new position has been reached.

In most situations, these characteristics are desirable, or at least tolerable. However, there are situations where one or more of them, especially the audible "click", is either annoying or actually detrimental to the situation which requires the switch to be changed. One such situation occurs during the testing of hearing loss in hearing impaired individuals. An astute subject can pick up clues as to switch setting from the clicking noises made as the switch is moved and, consciously or unconsciously, give an incorrect response to the test. However, in this same case, it is highly desirable that the operator of the test have a non-visual—that is, tactile—confirmation of switch operation.

No existing switch offers a combination of good tactile detent operation, noiseless operation of both the switching action and the detent, and ability to distinguish between clockwise and counter-clockwise rotation. Brebbia et al U.S. Pat. No. 3,597,714 discloses a magnetically actuated rotary switch, in which an annularly-shaped permanent magnet, with multiple poles radially spaced on the surface thereof, is placed opposite to a second annularly-shaped permanent magnet with multiple poles similarly placed, providing a detent action as one magnet is rotated past the other. The opposite face of the second annularly-shaped permanent magnet incorporates thereon shaped, magnetized zones whose radial position varies in one or more places. Small permanent magnets mounted on snap-acting switches which are placed within the magnetic influence of the shaped magnetized zones act in accordance with the radial deviations of the magnetized zones causing the switches to operate as the second annularly-shaped permanent magnet is rotated with respect to the switches. The snap acting switches would have a characteristic clicking or snapping sound as the mechanism was operated.

Lau U.S. Pat. No. 4,054,944 discloses a pushbutton type switch, in which a magnet is used to obtain a mechanical behavior similar to a non-magnetic mechanical switch. In addition to a characteristic tapping or clicking sound as the contacts came together, this switch has a different structure than the present invention.

Paulet U.S. Pat. No. 4,199,741 discloses a magnetic switch in which the switching behavior is accomplished by moving magnets actuating the switching elements in response to magnetic poles which are brought close to, or taken away from, the moving magnets as the switch body is rotated about an axis. The movement of the permanent magnets would likely produce noise which might be detected by the subjects being tested.

Lerner et al U.S. Pat. No. 4,353,049 discloses a magnetically actuated reed switch which rotates between two metallic walls in response to the rotation of a shaft attached to a knob. There would be a characteristic "slap" or "click" as the magnetic member contacted the two walls, in addition to the "snap" of the reed switch as it changed position.

None of the above disclosures is inherently noiseless in operation and would thus not qualify for use in situations where noiseless operations was needed in conjunction with a tactile indication of switch actuation.

Kenney U.S. Pat. No. 3,800,204 discloses a selector switch in which solid state switching devices are energized by admission of light to light sensitive trigger devices which actuate the switching devices. No provision is present for any tactile indication of switch operation.

Angersbach et al U.S. Pat. No. 3,995,156 discloses a photoelectrically sensitive device for determining the speed of rotation of a rotating member and the angular displacement thereof.

Edwards U.S. Pat. No. 4,146,970 discloses a detector for actuating a readout display for indicating the general direction of travel of an automobile.

Klein U.S. Pat. No. 4,326,128 discloses a rotary transmitter using photoelectric elements for minimizing fluctuation in transmitted signals due to inaccuracies in structure or assembly of the transmitter.

Cox et al U.S. Pat. No. 4,375,592 discloses a photoelectrically actuated encoder which utilizes one set of photodetectors spaced circumferentially from a second set of photodetectors a distance equal to one half of an increment of an incrementally divided rotating mask.

Although some of the above disclosures offer one or the other of the desirable features of a noiseless switch and a tactile detent, none of them offers both, nor could any of them be combined to obtain the novel structure of the present invention.

BRIEF DESCRIPTION OF THE PRESENT INVENTION

The present invention provides a noiseless rotary switch imparting a distinct tactile sensation to the user as the switch is turned from position to position by the shaft.

The tactile detent is obtained by passing projections, fabricated on a ferromagnetic member mounted on a rotatable shaft, in close proximity to a magnetic pole piece. Attempting to turn the shaft from a given rest rest position will be resisted by the magnetic attraction of the pole piece for the projection. As the shaft is rotated further, the next projection will begin to come into the magnetic influence of the pole piece and the shaft will suddenly become easier to turn, at which time the ferromagnetic member will suddenly accelerate until it comes to rest at the point of maximum attraction between the pole piece and the member. The user turning the shaft will experience a distinct tactile detent sensation which approximates that experienced with a mechanical detent switch.

The switching action for making interconnections between a multiplicity of electrical circuits is accomplished through the use of solid state switching devices activated by photosensitive elements which are alternately exposed to, and blocked from, light sources by the interposition of the projections fabricated on the rotatable ferromagnetic member.

The photosensitive elements are arranged so that in rest position, a first pair is normally blocked (that is, no light passes between a light source and a photodetector, while a second pair is only partially blocked (that is, only half the light is permitted to pass). When the shaft is turned in one direction, the second pair is fully unblocked before the first pair is unblocked, while the opposite state occurs when the shaft is turned in the opposite direction: that is, the second pair is fully blocked before the first pair is unblocked. Thus, direction of rotation is easily discerned. Means are provided for making the desired interconnection between the several external circuits according to the rest position of the ferromagnetic member, a particular rest position corresponding to a particular interconnection.

It is therefore a principal objective of the present invention to provide a noiseless rotary switch with a distinct tactile detent action.

It is a further objective of the present invention to provide noiseless rotary switch having a distinct tactile detent action using magnetic means.

It is another objective of the present invention to provide a noiseless rotary switch having a distinct tactile detent action by using the same element to obtain the detent action and to actuate the electrical switching operation.

These and other objectives, features and advantages of the present invention will be more readily understood upon consideration of the following detailed description of the invention taken in conjunction with the accompanying drawings.

DETAILED DESCRIPTION OF THE INVENTION

Figure 1:
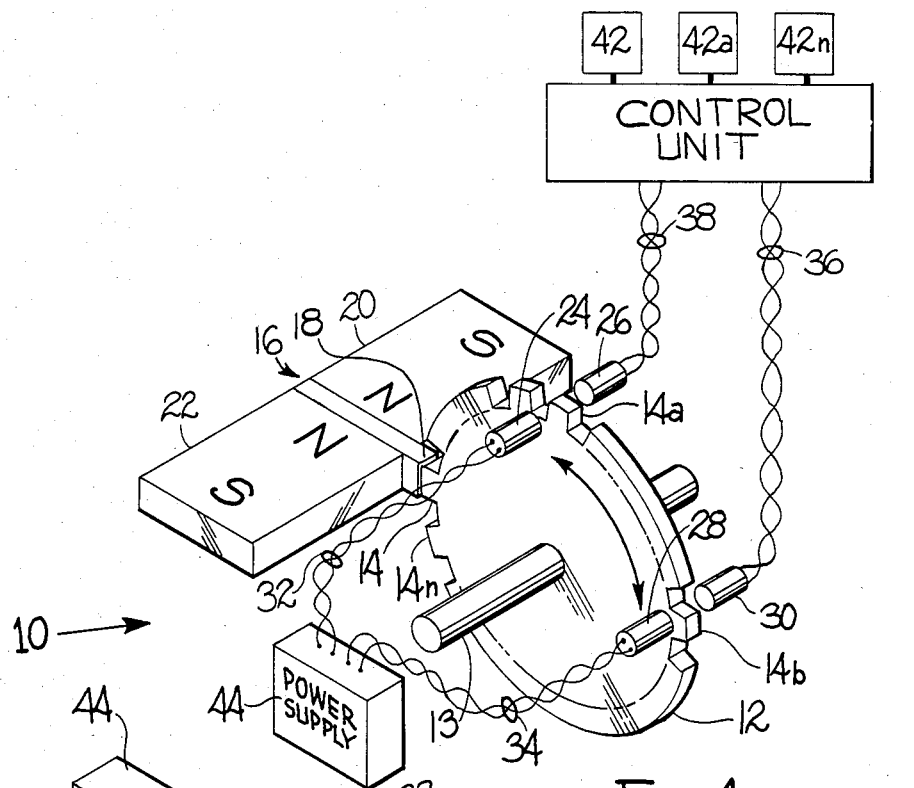
FIG. 1 is a highly diagrammatic perspective view of the present invention showing operating interrelationships between the various elements of the invention.

Turning now to FIG. 1, we see a perspective diagrammatic view of the invention 10, disclosing the operating inter-relationships of the various elements of the invention. The toothed wheel 12 is fixedly mounted on rotatable shaft 13, with teeth 14,14a,14b ... 14n projecting at equally spaced intervals around the periphery of the wheel. The invention also includes a magnetic component 16 comprising pole piece 18 and magnets 20 and 22, which are fixedly fastened to pole piece 18. The invention also includes a first set of photosensors comprising light emitting diode 24 and photosensitive detector 26, and a second set of photodetectors comprising light emitting diode 28 and photodetector 30. The pairs of conductors 32 and 34 conduct electrical energy to LED's 24 and 28, respectively, and the pairs of conductors 36 and 38 convey signals from the photodetectors 26 and 30, also respectively, as hereinafter more completely described. The shaft 13 will include a knob or pointer to assist a user in rotating the shaft as desired.

Figure 2:
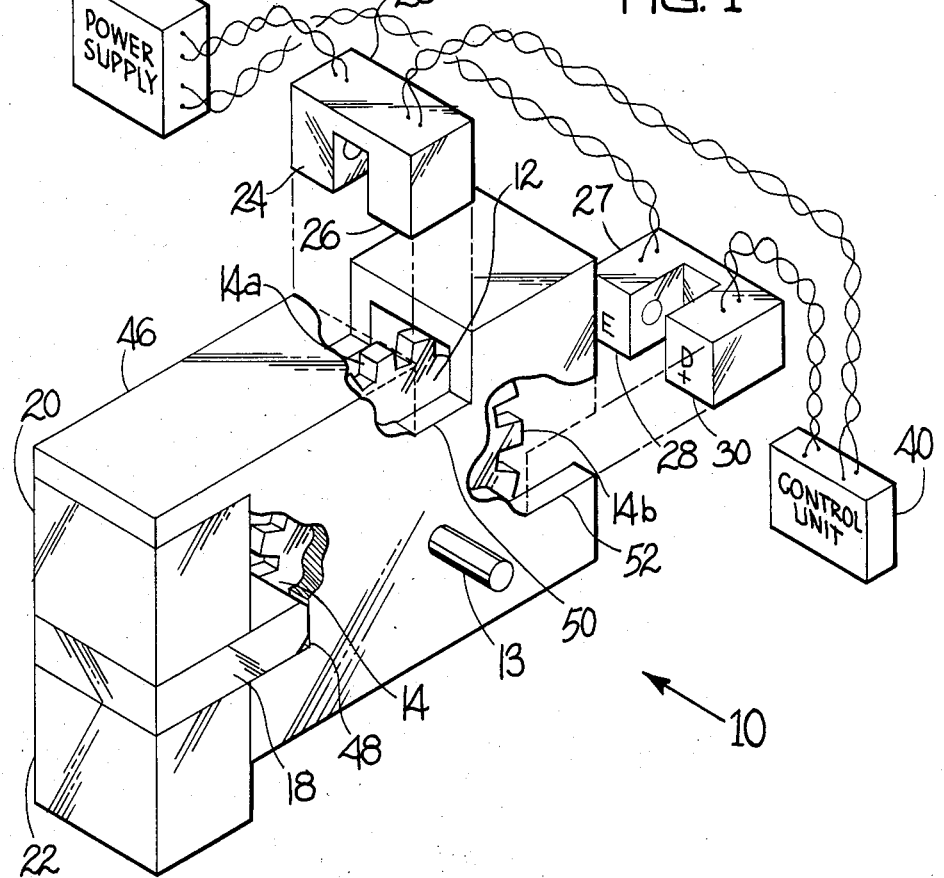
FIG. 2 is a perspective view of a preferred embodiment of the invention.

The novel operation of the invention 10 depends upon the novel structure. The magnetic pole piece 18 is located so that there is only a small gap between the face of the pole piece and the tip of the projection, or tooth, 14. The gap can be made adjustable, if desired, to strengthen or weaken the detent action, although the preferred embodiment, as shown in FIG. 2, is not adjustable. The magnets 20 and 22 are affixed to pole piece 18 with like poles opposing each other on each side of the pole piece: that is, with either both N poles affixed to the pole piece, or with both S poles so affixed. This arrangement intensifies the magnetic field emanating from the pole piece and consequently intensifies the detent action as experienced by the user.

Pairs of conductors 38 and 36 convey the signals from the photodetectors 26 and 30 respectively to the switching control unit 40, which determines whether the shaft 13 is turning clockwise or counterclockwise, and actuates the switching elements (not shown) to make the desired interconnections with external circuits 42,42a .. . 42n. Pairs of conductors 32 and 34 conduct electrical energy from power supply 44 to LEDs 24 and 28.

FIG. 2 discloses the physical form of the preferred embodiment, with electrical connections diagrammatically indicated for clarity. The member 46 is a piece of U-bar, of non-magnetic material such as aluminum, of appropriate dimensions and fabricated as hereinafter described. The magnets 20 and 22 are cemented to the pole piece 18 and this assembly (corresponding to magnetic component 16 in FIG. 1) is cemented to the U-bar as shown. Pole piece 18 is inserted into slot 48, which is milled into the U-bar for this purpose. The edges of pole piece 18 can be beveled so that the face of the pole piece facing the projection or tooth 14 is more nearly the dimensions of the tooth 14.

The first set photosensors 23, comprised of LED 24 and photodetector 26, and the second set of photosensors 27, comprised of LED 28 and photodetector 30, are inserted into slots 50 and 52, respectively, milled into U-bar 46, as hereinafter more completely described. The toothed wheel 12 with shaft 13 is assembled in place, the toothed wheel being of iron or other ferromagnetic material. To aid in assembly, reduce friction, and increase operating life, the shaft can be supported in appropriate bearings (not shown) inserted in the walls of the U-bar.

The slots 50 and 52, into which the photosensors 23 and 27, respectively, are pressed, are located precisely with respect to the toothed wheel 12 as now to be described. The axis of the light beam between LED 24 and photodetector 26 is located so that is strikes projecting tooth 14a squarely in the center: that is, tooth 14a totally blocks any light energy from LED 24 from reaching photodetector 26. Light passes between LED 24 and photodetector 26 only when toothed wheel 12 is turning between adjacent teeth. The axis of the light beam between LED 28 and photodetector 30 is located so that it passes just across the upper surface of projecting tooth 14b: that is, tooth 14b blocks one-half the light energy of LED 28 from reaching photodetector 30. The significance of this structure is that as toothed wheel 12 is turned clockwise, photodetector 30 detects an *increase* in received light energy while photodetector 26 is receiving no energy. As toothed wheel 12 is turned countercloskwise, photodetector 30 detects a *decrease* in received light energy while photodetector 26 is receiving no energy. This arrangement permits a distinction to be made between clockwise and counterclockwise rotation, facilitating appropriate switching arrangements to obtain desired interconnections between external circuits.

It will be appreciated by those skilled in the art that several of the aforementioned physical arrangements and relationships could be changed without departing from the inventive concept heretofore described. For example, any of several types of detectors could be used instead of photosensitive devices, and their relationships with respect to the projections or teeth could be changed also. The spatial relationships shown could be modified from the 90° and 180° positions shown, to fit special requirements: in fact, all of the functions heretofore described could be accomplished by grouping the magnet and the detectors around a single projection or tooth to obtain a toggle type operation, where a switch handle is pressed in one direction to obtain one result and in the opposite direction to obtain another result (not necessarily the opposite result).

Another physical change that could be made without departing from the spirit or intent of the invention is that the projections from the wheel 12 do not have to be co-planar with the wheel: they could be at an angle. In fact, a wheel could be fabricated with projections co-planar with, and at right angles to, the wheel 12, so that several operations could be controlled at the same time, with the same or various phase relations between them. It will further be evident to those skilled in the art that a plurality of such wheels could be mounted on the same shaft, or on shafts geared or otherwise connected to the shaft 13 of the invention so that a plurality of operations could be controlled as desired.

The switch control unit 40 can contain the circuitry necessary to accomplish switching of the interconnections desired with the external circuits, by means well-known in the art. Since the purpose of the invention is to provide a switch control which does not give detectable clues to those being tested for hearing loss, noiseless switching devices such as solid state switching devices can be used as desired. Of course, there are many other uses which would be appropriate for the novel switch herein described.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What we claim as our invention is:

1. A noiseless magnetic detent switch for making interconnection between circuits, and having a rest position, comprising:
   a. a magnetic pole piece;
   b. a ferromagnetic member movably mounted with respect to said pole piece, said member having a first edge and a second edge and being in close proximity to said pole piece in said rest position;
   c. detection means for detecting said first edge when said member is moved in one direction from said rest position and for detecting said second edge when said member is moved in the opposite direction to said one direction from said rest position; and
   d. means for making said interconnection in response to said detection of said first edge and for disconnecting said interconnection in response to said detection of said second edge.

2. A noiseless magnetic detent switch for making interconnections between a multiplicity of electrical circuits and having rest positions equal in number to the number of said interconnections, each rest position corresponding to a particular one of said interconnecions, comprising:
   a. a magnetic pole piece;
   b. a rotatable shaft having a ferromagnetic member fixedly mounted thereon, said member having a projection thereon corresponding to each of said rest positions, each of said projections having a first edge and a second edge, said projections being brought successively into close proximity to said pole piece when said shaft is rotated;
   c. first detection means for detecting the presence or absence of one of said projections;
   d. second detection means for detecting said first and said second edges, respectively; and
   e. means connected to said first and said second detection means for determining the direction of rotation of said shaft and for making said interconnections corresponding to said rest positions.

3. A noiseless magnetic detent switch for making interconnections between a multiplicity of electrical circuits and having rest positions equal in number to the number of said interconnections, each rest position corresponding to a particular one of said interconnections, comprising:
   a. a magnetic pole piece;
   b. a rotatable shaft having a ferromagnetic member fixedly mounted thereon, said member having a projection thereon corresponding to each of said rest positions, each of said projections having a first edge and a second edge, said projections being brought successively into close proximity to said pole piece when said shaft is rotated;
   c. means for determining the direction of rotation of said shaft, including:
      1. first detection means for determining the presence or absence of one of said projections in said rest position;
      2. second detection means for detecting an increase or decrease in the presence of one of said projections as said shaft is rotated from said each of said rest positions, during said presence of said one of said projections in said rest position.

4. The magnetic detent switch of claim 1, wherein said detection means includes a light beam received by a photosensitive element, said light beam being interrupted by said first edge when said member is moved in said one direction, and by said second edge when said member is moved in said opposite direction.

5. The magnetic detent switch of claim 2, wherein said first detection means includes a light beam received by a photosensitive element, said light beam being blocked by one of said projections when said magnetic detent switch is in a corresponding one of said rest positions.

6. The magnetic detent switch of claim 5, wherein said second detection means includes a second light beam received by a second photosensitive element, said second photosensitive element being partially blocked by one of said projections when in one of said rest positions and receiving substantially one-half of the light energy of said second light beam.

7. The magnetic detent switch of claim 3, wherein said first detection means includes a light beam received by a photosensitive element, said light beam being interrupted by one of said projections when said switch is in one of said rest positions.

8. The magnetic detent switch of claim 7, wherein said second detection means includes a second light beam received by a second photosensitive element, said second photosensitive element being patially blocked by one of said projections when in one of said rest positions and receiving substantially one-half of the light energy of said second light beam.

9. A noiseless magnetic detent switch for making interconnections between a multiplicity of electrical circuits and having rest positions equal in number to the number of interconnections, each rest position corresponding to a particular one of said interconnections, comprising:
   a. a magnetic pole piece;
   b. a rotatable shaft having a ferromagnetic member fixedly mounted thereon, said member having a projection thereon corresponding to each of said rest positions, each of said projections having a first edge and a second edge, said projections being brought successively into close proximity to said pole piece when said shaft is rotated;
   c. first detection means, including a first light beam received by a first photosensitive element;
   d. second detection means, including a second light beam received by a second photosensitive element;
   e. in any of said rest positions:
      1. said first light beam being blocked by one of said projections, said first photosensitive element receiving no light energy thereby; and
      2. said second light beam being partially blocked by another of said projections, said second photosensitive element receiving substantially one-half the light energy of said second light beam; and
   f. means connected to said first and said second detection means for determining the direction of rotation of said shaft and for making said interconnections.

* * * * *